US010830829B2

United States Patent
Gelso et al.

(10) Patent No.: US 10,830,829 B2
(45) Date of Patent: *Nov. 10, 2020

(54) METHOD FOR MONITORING THE STATUS OF A PLURALITY OF BATTERY CELLS IN A BATTERY PACK

(71) Applicant: VOLVO TRUCK CORPORATION, Gothenburg (SE)

(72) Inventors: Esteban Gelso, Gothenburg (SE); Jonas Hellgren, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 256 days.

This patent is subject to a terminal disclaimer.

(21) Appl. No.: 15/567,796

(22) PCT Filed: May 8, 2015

(86) PCT No.: PCT/EP2015/060226
§ 371 (c)(1),
(2) Date: Oct. 19, 2017

(87) PCT Pub. No.: WO2016/180442
PCT Pub. Date: Nov. 17, 2016

(65) Prior Publication Data
US 2018/0106869 A1    Apr. 19, 2018

(51) Int. Cl.
*G01R 31/396* (2019.01)
*G01R 31/367* (2019.01)
(Continued)

(52) U.S. Cl.
CPC ..... *G01R 31/396* (2019.01); *G01R 19/16542* (2013.01); *G01R 31/367* (2019.01);
(Continued)

(58) Field of Classification Search
CPC .................................................. G01R 31/396
See application file for complete search history.

(56) References Cited

U.S. PATENT DOCUMENTS 5,491,834 A    2/1996 Chia
6,081,095 A    6/2000 Tamura et al.
(Continued)

FOREIGN PATENT DOCUMENTS

CN    201174408 Y    12/2008
CN    102468674 A     5/2012
(Continued)

OTHER PUBLICATIONS

International Search Report (dated Jan. 25, 2016) for corresponding International App. PCT/EP2015/060226.
(Continued)

*Primary Examiner* — Hyun D Park
(74) *Attorney, Agent, or Firm* — Venable LLP; Jeffri A. Kaminski

(57) ABSTRACT

A method is provided for monitoring the status of a plurality of battery cells in a battery pack the method including: arranging the battery cells in at least two groups of cells; connecting the groups of cells to a sensor unit; and obtaining, by means of the sensor unit, at least one sensor measurement for each group which is indicative of the state of operation of the battery pack. The method according to the invention further includes: determining a cell measurement for each battery cell by means of an over-determined equation system which defines the cell measurement as a function of the sensor measurement; and evaluating any residual terms resulting from the equation system in order to identify any battery cell having a cell measurement which deviates from an expected value based on the remaining battery cells. A battery management system for monitoring the status of a plurality of connected battery cells as mentioned above is also provided.

11 Claims, 4 Drawing Sheets

(51) Int. Cl.
*G01R 19/165* (2006.01)
*H02J 7/00* (2006.01)
*G01R 31/3835* (2019.01)

(52) U.S. Cl.
CPC ..... *G01R 31/3835* (2019.01); *H01M 2220/20* (2013.01); *H02J 7/0021* (2013.01); *Y02T 10/7055* (2013.01)

(56) References Cited

U.S. PATENT DOCUMENTS

| | | | |
|---|---|---|---|
| 2006/0071643 A1* | 4/2006 | Carrier | H01M 10/4257 320/132 |
| 2006/0273802 A1 | 12/2006 | Murakami et al. | |
| 2011/0089953 A1 | 4/2011 | Chaudler et al. | |
| 2012/0153961 A1 | 6/2012 | Kobayashi et al. | |
| 2014/0025323 A1 | 1/2014 | Chao et al. | |

FOREIGN PATENT DOCUMENTS

| | | |
|---|---|---|
| CN | 102735913 A | 10/2012 |
| CN | 103645372 A | 3/2014 |
| CN | 103812191 A | 5/2014 |
| DE | 102012222720 A1 | 6/2014 |
| EP | 1806592 A1 | 7/2007 |
| EP | 2330431 A1 | 6/2011 |
| EP | 2412581 A1 | 2/2012 |
| WO | 2015185070 A1 | 12/2015 |

OTHER PUBLICATIONS

Chinese Office Action dated Oct. 21, 2019 in corresponding CN Application No. 201580079707.9, 22 pages.

* cited by examiner

METHOD FOR MONITORING THE STATUS OF A PLURALITY OF BATTERY CELLS IN A BATTERY PACK

BACKGROUND AND SUMMARY

The present invention relates to a method for monitoring the status of a plurality of battery cells in a battery pack. The method comprises arranging said battery cells in at least two groups of cells; connecting said groups of cells to a sensor unit; and obtaining, by means of said sensor unit, at least one sensor measurement for each group which is indicative of the state of operation of said battery pack.

The invention also relates to a battery management system for monitoring the status of a plurality of connected battery cells in a battery pack. The system comprises at least two groups of said plurality of cells and a sensor unit connected to each of said groups. The sensor unit is configured for providing at least one sensor measurement for each group which is indicative of the state of operation of said battery pack.

The invention can be applied in vehicles, such as cars, trucks, buses and construction equipment. Although the invention will be described below with respect to an application in the form of a bus, the invention is not restricted to this particular type of vehicle, but may be used in other vehicles.

In the field of vehicles, there is a steady increase in research and development related to propulsion of vehicles with alternative power sources, i.e. power sources being used as alternatives to conventional internal combustion engines. In particular, electrically operated vehicles have emerged as a promising alternative.

According to today's technology, a vehicle can be operated by means of an electric machine solely, or by means of an arrangement comprising both an electric machine and an internal combustion engine. The latter alternative is often referred to as a hybrid vehicle (HEV), and can for example be utilized in a manner in which an internal combustion engine is used for operating the vehicle while driving outside urban areas whereas the electric machine can be used in urban areas or in environments in which there is a need to limit the discharge of harmful pollutants such as carbon monoxide and oxides of nitrogen.

The technology involved in electrically operated vehicles is closely related to the development of electrical energy storage systems, such as battery-related technology for vehicles. Today's electrical energy storage systems for vehicles may comprise a battery pack with a plurality of rechargeable battery cells which, together with control circuits, form a system which is configured for providing electric power to an electric machine in a vehicle.

A vehicle which is operated by means of an internal combustion engine and an electric machine supplied with power from a rechargeable electrical energy storage system is sometimes referred to as a plug-in hybrid electric vehicle (PHEV). A plug-in hybrid electric vehicle normally uses an energy storage system with rechargeable battery cells which can charged through a connection to an external electric power supply. During charging, a high amount of energy is fed into the energy storage system in a relatively short time in order to optimize the vehicle's range of driving. For this reason, the actual charging of the energy storage system is suitably implemented through a process in which a control unit on the vehicle requests a charging process to be carried out by means of an external electric power supply. This is carried out after the energy storage system and the external power supply have been electrically connected by means of suitable connector elements.

In the field of automotive technology, an energy storage system normally comprises a battery pack with a large number of battery cells. Using a plug-in hybrid vehicle as an example, a battery pack may for example be of the lithium-ion type. In the event that a 600 V lithium-ion battery pack is used, approximately 200 battery cells connected in series will then be needed to achieve a desired voltage in order to operate the vehicle. The available range for driving the vehicle depends on certain parameters such as the state of charge (SOC) of the battery pack. The state of charge is an important parameter to use in order to prevent batteries from being operated during under- or over-charging situations, and to manage the energy in electric vehicles. The state of charge needs to be estimated since no direct measurement is available for this parameter.

Furthermore, it is known that batteries degrade over time, and there is a need for a diagnosis of any decrease in performance estimated by means of battery parameters, such as for example the cell terminal voltage, the cell capacity and the ohmic resistance of each cell. These parameters can be used for health monitoring, for estimating the so-called state of health (SOH) of the battery pack, and for predicting when the battery pack will fail to operate or reach its end of life.

It is also known to use a battery management system in a vehicle in order to ensure safe operating conditions of the vehicle. In such a battery management system, there could be provided a voltage sensor for each battery cell in order to measure the cell terminal voltage for each cell. Since monitoring of each cell is desired, this task is very time consuming since a battery pack could include many cells. As a result, this process may put heavy demands on a control unit as regards the capacity for measurements and calculations. There is consequently a need for more accurate and efficient monitoring of the battery cells of a battery pack. In particular, it is necessary to estimate parameters such as the state of charge (SOC) and the state of health (SOH) of a battery pack. Such estimation could be carried out by means of a sensor arrangement configured for measuring one or more parameters which can consequently be used as an indication of the state of operation of the battery pack.

The patent document US 2006/273802 teaches a system in which voltage data for a battery pack is obtained and voltage correction values are determined from a system of various equations. The document also discloses a system for determining the occurrence of abnormal batteries, i.e. batteries that show discrepancies as compared with a normal condition, based on averages between different voltage measurement systems.

Furthermore, the patent document U.S. Pat. No. 6,081,095 teaches a voltage balancer system which is configured for detecting individual deviating cells by comparison with average voltage values.

Although the known systems are arranged for monitoring a battery pack with a number of battery cells, there is a general problem with previous solutions for monitoring battery cells in the sense that they are relatively complex, time-consuming and costly with regard to battery measurements and calculations.

Consequently, it is desirable to provide an improved method and system for monitoring a plurality of battery cells of a battery pack. Which solve the problems associated with prior solutions and which also can be used for detecting abnormal conditions, such as for example over-voltage and under-voltage, which may occur among said battery cells.

According to an aspect of the present invention, a method is provided for monitoring the status of a plurality of battery cells in a battery pack, said method comprising: arranging said battery cells in at least two groups of cells; connecting said groups of cells to a sensor unit; and obtaining, by means of said sensor unit at least one sensor measurement for each group which is indicative of the state of operation of said battery pack. The method also comprises: determining a cell measurement for each battery cell by means of an over-determined equation system which defines said cell measurement as a function of said sensor measurement; and evaluating any residual terms resulting from said equation system in order to identify any battery cell having a cell measurement which deviates from an expected value based on the remaining battery cells.

According to an embodiment, the method comprises determining cell measurements corresponding to said residual terms by means of a recalculation of said over-determined equation system using information from the previous calculation of said equation system.

By means of the invention, certain advantages are obtained. Firstly, it can be noted that the invention provides an improved method for monitoring of the battery pack which contributes to a reduced complexity and a decreased computational workload during monitoring.

According to an embodiment, the method comprises arranging said groups of cells in a manner so that at least two of said groups comprise two or more cells, and at least two of said groups overlap so that a cell forms pan of said overlapping groups. The method also comprises connecting said sensor unit to said groups; wherein the number of groups is less than the number of cells. This embodiment provides an advantage in the form of a reduction of the number of required sensors associated with the battery pack.

According to another aspect of the present invention, a battery management system is provided for monitoring the status of a plurality of connected battery cells in a battery pack, comprising: at least two groups of said plurality of cells; a sensor unit connected to each of said groups, said sensor unit being configured for providing at least one sensor measurement for each group which is indicative of the state of operation of said battery pack. The system also comprises a battery control unit to which said sensor unit is connected, said battery control unit being configured for determining a cell measurement for each battery cell by means of an over-determined equation system which defines said cell measurement as a function of said sensor measurement. The battery control unit is also configured for evaluating any residual terms resulting from said equation system in order to identify any battery cell having a cell measurement which deviates from an expected value based on the remaining battery cells.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

DETAILED DESCRIPTION

Different aspects of the present disclosure will be described more fully hereinafter with reference to the enclosed drawings. The method and system disclosed herein can, however, be realized in many different forms and should not be construed as being limited to the aspects set forth herein.

Figure 1:
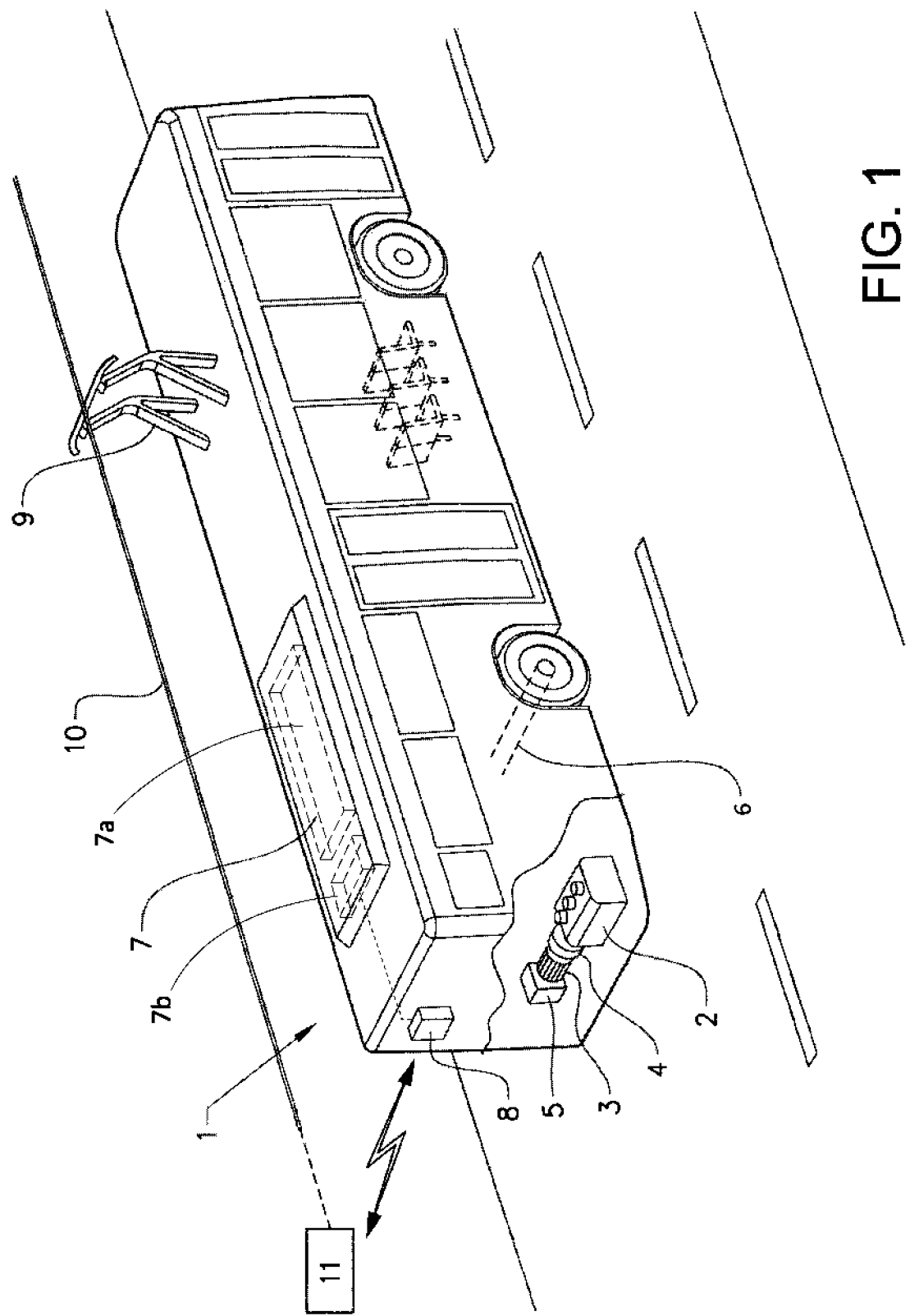
FIG. 1 shows a schematical view of a hybrid vehicle in the form of a bus, in which the present invention can be used.

With initial reference to FIG. 1, there is shown a simplified perspective view of a vehicle in the form of a bus 1 which according to the embodiment is of the so-called plug-in hybrid type which is equipped with an internal combustion engine 2 and an electric machine 3 which are connected to each other via a clutch 4. Both the internal combustion engine 2 and the electrical machine 2 can be used to drive the bus 1.

The electric machine 3 is connected to a gearbox 5, which in turn is connected to a rear axle 6 of the bus 1. In a manner which is known as such and therefore not described in detail, the internal combustion engine 2 and the electric machine 3 can be used for driving the rear axle 6. According to the embodiment, the electric machine 3 is used as a combined electric drive motor and generator, and is suitably also used as a starter motor for the internal combustion engine 2.

The bus 1 carries an electric energy storage system 7 which comprises a battery pack 7a which in turn comprises a plurality of battery cells (not shown in detail in FIG. 1). As will be described in greater detail below, the battery cells are connected in series to provide an output DC voltage having a desired voltage level. Suitably, the battery cells are of lithium-ion type, but other types may also be used.

The energy storage system 7 also comprises a sensor unit 7b which is arranged for measuring one or more predetermined parameters which are indicative of the state of operation of the battery pack 7a. For example, the sensor unit 7b can be configured for measuring the voltage of the battery pack 7a and its battery cells. Furthermore, the sensor unit 7b can be configured for measuring an alternative parameter such as the battery current or the temperature of each battery cell. As will be described in detail below, the parameter or parameters measured by means of the sensor unit 7b can be used for controlling the condition of the battery pack 7a.

According to an embodiment, the energy storage system 7 is arranged on the roof of the bus 1, as indicated in FIG. 1. The above-mentioned components of the propulsion system of the bus 1, including the energy storage system 7, are connected to a vehicle control unit 8.

Even though this disclosure refers to a battery pack 7a used in a vehicle 1 in the form of a bus, it relates generally to monitoring the status of a battery pack in virtually any type of vehicle which is operated by means of at least an electric machine and which has an energy storage system comprising a battery pack with a number of battery cells. Examples of types are full electric vehicles and other configurations of hybrid electric vehicles.

During certain modes of operation of the bus 1, it is suitable to use the electric machine 3 for operating the bus 1. This means that the energy storage system 7 will deliver power to the electric machine 3, which in turn is driving the rear axle 6. During other modes of operation of the bus 1, for example when the state of charge of the energy storage system 7 is determined as not being sufficient for operating the bus 1 by means of the electric machine 3, the internal combustion engine is connected, via the clutch 4 and the gearbox 5, to the rear axle 6. The manner in which an electric machine and an internal combustion engine can be combined and used for operating a vehicle is generally previously known and for this reason, it is not described in any greater detail here.

The bus 1 is equipped with a first electric connector element 9, suitably in the form of a pantograph, which is mounted on the roof of the bus 1 and which is arranged for being connected to a second electric connector element 10 in the form of an overhead electrical conductor wire which forms part of an external power supply 11 and is configured for conducting a charging current having a certain voltage. In this manner, the energy storage system 7 can be supplied with an electrical current, by means of the connection between the overhead wire 10 and the pantograph 9, in order to charge the battery pack 7a.

According to an embodiment, the pantograph 9 and the overhead wire 10 are arranged so that charging of the energy storage system 7 takes place while the bus 1 is standing still, i.e. either at a charging station at a bus terminal or at a bus stop or a similar position. It should be noted that other types of processes can be implemented for charging the electrical storage system 7 than shown in FIG. 1, for example using electric plugs feeding current from an external power supply and being connected into a corresponding socket arranged in the vehicle.

An embodiment of the invention will now be described in greater detail with reference to FIG. 2, which is a simplified schedule of the battery pack 7a and associated components of the vehicle 1. All components shown in FIG. 1 are not shown in FIG. 2.

As explained above, the battery pack 7a comprises a number of battery cells C1, C2, C3, . . . etc. (also referred to with reference numeral "C") which according to an embodiment is suitably in the magnitude of 200 cells, although the specific number may vary. According to an embodiment, the battery cells are of the lithium ion type, although the principles of the invention are equally applicable to other types of battery cells.

The battery pack 7a is connected to the electric machine 3 and is configured for operating said electric machine 3 (which in turn operates the vehicle 1). Furthermore, the battery pack 7a is connected to a sensor unit 7b, which in turn is connected to the battery control unit 8.

As mentioned above, the invention is configured for monitoring the status of the battery pack 7a, i.e. for monitoring the status of each battery cell C. For this reason, and according to an embodiment, the sensor unit 7b is configured for measuring one or more operating parameters for the battery pack 7a. According to an embodiment, such an operating parameter can be the voltage (U) of each battery cell. Consequently, the sensor unit 7b is configured for measuring the terminal voltage U for each battery cell C and for transmitting information related to the measured voltage values to the battery control unit 8. Using these voltage values, the control unit 8 may determine the state of charge (SOC) of the battery pack 7a.

Figure 2:
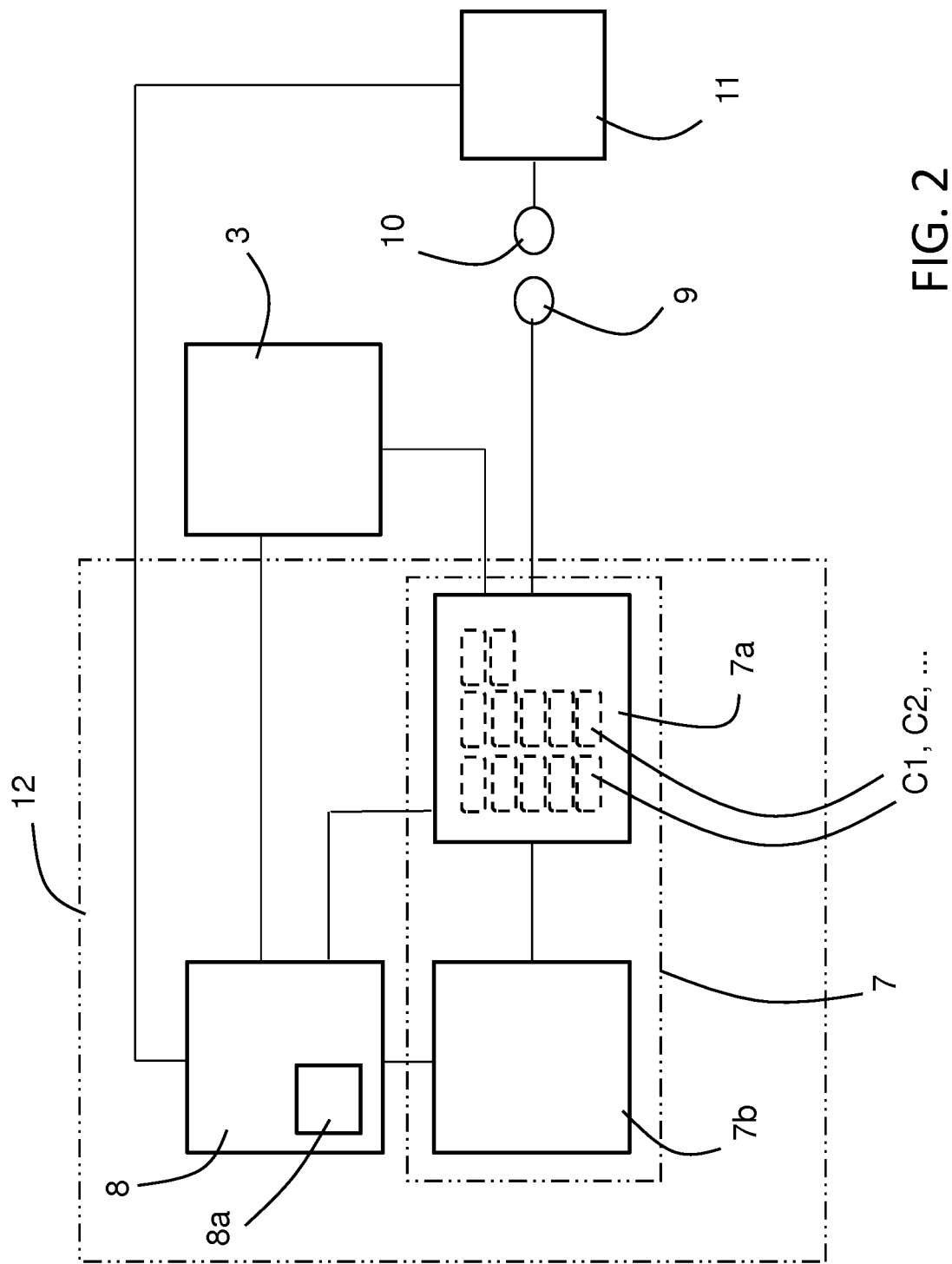
FIG. 2 is a schematic view of a battery management system for a vehicle, in accordance with an embodiment of the invention.

FIG. 2 also shows in a schematical manner the first connector 9, forming part of the vehicle, and the second connector 10, forming part of the external power supply 11. Consequently, the battery pack 7a, the sensor unit 7b and the control unit 8 constitute a battery management system 12 which is arranged for monitoring the status of the battery cells C. There are three main objectives of the battery management system 12; firstly, to provide an internal state estimation of parameters such as the state of charge (SOC), the state of power, the state of health etc. of the battery pack 7a; secondly, to provide a cell balancing procedure (which requires measurements of the state of charge and voltage of all battery cells); and thirdly, to provide fault handling when certain conditions such as over-charging or over-heating have been detected.

The control unit 8 is configured for detecting faults related to the operation of the battery pack by means of the voltage measurements, i.e. in the event that the result of the measurement deviates from an expected value or interval of values. For example, a fault could be the result of a premature ageing of a battery cell. In the context of this invention, a fault should be understood to be a deviation of at least one parameter which is related to the battery pack 7a from an acceptable condition. However, requirements and methods for cell balancing of the battery pack 7a will not be described in any further detail here.

The status of the battery pack 7a and its battery cells C can be described with parameters such as its state of charge (SOC) and state of health (SOH). The state of charge (SOC) corresponds to the remaining amount of charge in the battery pack 7a and is for this reason estimated continuously. The stage of health (SOH) can be monitored and estimated by measuring the cell capacity (Ah) of each battery cell C and also by measuring the ohmic resistance (ohms) of each battery cell C.

As will be described in greater detail below, this disclosure relates to a method for determining one or more operating parameters of the battery pack 7a by means of battery cell measurements of said parameter or parameters and through the use of an over-determined equation system which defines these cell measurements as a function of measurements implemented by the sensor unit 7b. This will be implemented by means of an evaluation unit 8a as indicated schematically in FIG. 2.

Figure 3:
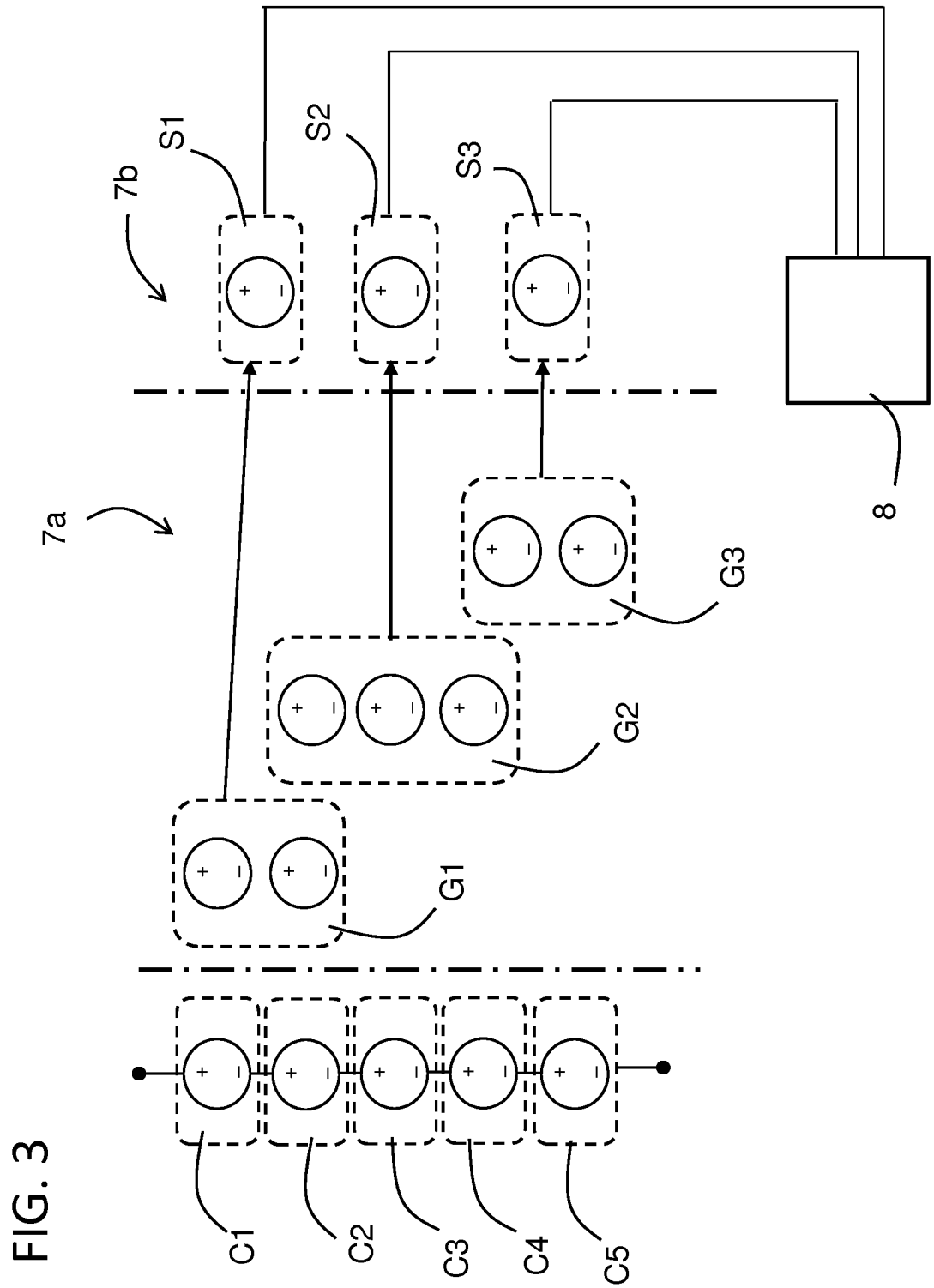
FIG. 3 is a schematic view of a battery pack according to an embodiment of the invention.

With reference to FIG. 3, there is shown a number of battery cells C1, C2, . . . C5 (i.e. C1-C5) which are arranged in series, i.e. so that they together form a unit having a voltage which is constituted by the sum of each individual voltage of each battery cell C1-C5. The example shown in FIG. 3 is simplified in the sense in that it comprises five individual battery cells C1-C5, but the invention can be implemented with generally any number of battery cells arranged in a battery pack.

As mentioned above, there is a desire to arrange the sensor unit 7b (see also FIGS. 1 and 2) so as to provide a measurement of at least one parameter which reflects the state of operation of the battery pack 7a. According to an embodiment, there is provided a measurement of the voltage (U) of each battery cell C1-C5 by means of said sensor unit 7b.

According to alternative embodiments, the battery management system 12 according to the invention may be configured for measuring other parameters than the battery voltage as indicators of the state of operation of the battery pack 7a. Purely as examples, such parameters can be the battery current (I) or the battery temperature (T). Both these parameters can be used for controlling the status of the battery pack 7a.

In order to provide measurements, the sensor unit 7b comprises a number of voltage sensors S1, S2, S3 (also referred to as "S1-S3"). According to known technology, a sensor unit may comprise a voltage sensor for each battery cell in a battery pack. However, according to an embodiment, a hierarchical model is used in order to reduce the number of necessary voltage sensors and in order to minimize the complexity of computations in the control unit. In this manner, the cost-efficiency of the complete sensor unit and control unit can be increased.

In order to obtain this, the embodiment shown in FIG. 3 is configured with a battery pack 1 which is arranged in a manner so that the battery cells C1-C5 are arranged in a plurality of groups of battery cells. This is indicated with reference numerals G1, G2, G3 in FIG. 3. It should be noted that groups which contain two or more battery cells (such as the group G1, containing two battery cells C1, C2) as well as groups which contain only one single battery cell (none shown in FIG. 3) are referred to as "groups" in the context of this invention.

As indicated in FIG. 3, each of these groups of cells G1-G3 are connected to the sensor unit 7b, in particular so that:

a first pony G1 is connected to a first sensor S1;
a second group G2 is connected to a second sensor S2; and
a third group G3 is connected to a third sensor S3.

According to an embodiment, there is consequently provided a hierarchical model which is decomposed into a collection of sub-systems. A number of sensors S1-S3 which is less than the number of battery cells C1-C5 is provided, which leads to a concept which is more cost-efficient that previously known solutions. This concept will now be described with reference to an example: if the first sensor S1—which is associated with the first group G1—does not indicate any error (for example in the form of a detected voltage level which is lower than a certain threshold level) and if the second sensor S2 indicates that there is an error, it can be assumed that either the third battery cell C3 or the fourth battery cell C4 is faulty. If the third sensor S3 (which is associated with the third group G3) does not indicate any error, it can ultimately be assumed that it is the third battery cell C3 which is the faulty one.

Similar processes for determining where any detected error originates from can be deduced for all the battery cells C1-C5. Consequently, the measurements related to all five battery cells C1-C5 are registered by using no more than three voltage sensors S1-S3. This means that the cost of the sensor unit 7b can be decreased while the possibilities for detecting various parameters of the battery cells C1-C5 can be maintained. In this example, the computational load has been decreased 40% since the number of sensor units has decreased by 40%.

In order to accomplish this, the embodiment shown in FIG. 3 is arranged so that the groups of cells G1-G3 are configured so that at least two of the groups G1-G3 comprise two or more cells, and also so that least two of the groups G1-G3 overlap so that a battery cell (for example battery cell C2 in FIG. 3) forms part of the overlapping groups. Also, the sensor unit 7b is connected to the groups G1-G3 in a manner so that each of the groups G1-G3 is connected to a corresponding sensor S1-S3 which forms part of the sensor unit 7b. The sensor unit 7b is arranged so that there is one estimation of a measured value per group. Finally, the number of groups G1-G3 is less than the number of cells C1-C5.

According to an aspect, the groups G1-G3 of battery cells C1-C5 are arranged in a manner so that it fulfills the following relationship:

number of groups−number of cells/2≥1

This corresponds to the embodiment shown in FIG. 3, which shows five battery cells C1-C5 and three groups G1-G3. This set-up consequently fulfills the relationship above.

The sensors S1-S3 are configured for measuring at least one parameter related to the state of operation of the battery cells C1-C5. According to an embodiment, the terminal voltage (U) of the battery cells C1-C5 is used as the relevant sensor signal. The measured voltage values can be transmitted to and used in the control unit 8 for estimating a certain property of the battery cells C1-C5 or groups of cells G1-G3. According to an embodiment, the control unit 8 is arranged for estimating the state of charge, and optionally other parameters such as the cell capacity and the ohmic resistance of each battery.

Generally, the sensor unit 7b is configured for obtaining a sensor measurement ($U_1^{sens}$, $U_2^{sens}$, $U_3^{sens}$) for each group (G1-G3) which is indicative of the state of operation of said battery pack 7a. Also, the control unit 8 (see also FIG. 2) may generate an indication of a fault in the event that the result of the measurement of any of the above-mentioned parameters deviates from an expected value. This is suitably carried out using the principles shown in FIG. 3, i.e. with the battery cells C1-C5 arranged in groups G1-G3 as explained and with sensors S1-S3 being associated with the groups G1-G3. In the event that the measurements from the sensors S1-S3 should indicate that any of the battery cells (C1-C5) is defective, the battery management system 12 issues an indication or a warning signal.

At this stage, it should be noted that the embodiment shown in FIG. 3 is based on an arrangement with the battery cells C1-C5 being configured in the three groups (G1-G3) of cells, said groups being connected to one sensor (S1-S3) each. This leads to advantages with fewer sensors, less wiring and less computational costs. However, the invention can in principle be implemented without arranging the battery cells and sensor in a number of groups. In other words, the invention is equally applicable in an embodiment in which each battery cell has its own sensor. The general purpose of the invention is to monitor the status of a plurality of battery cells (C1-C5), and this can be obtained even if the battery cells (C1-C5) are not configured in groups as shown in FIG. 3.

According to this disclosure, there is proposed a method which involves determining battery cell measurements $U_1^{cell}$, $U_2^{cell}$, . . . etc for each battery cell C1-C5 by means of an over-determined equation system which defines said cell measurements as a function of said sensor measurement $U_1^{sens}$, $U_2^{sens}$, $U_3^{sens}$. In the following, the method describes how the cell voltages are estimated from the group voltage measurements S1-S3. According to the method, there can be defined minimum and maximum voltage values in order to detect abnormal under-voltage or over-voltage conditions, which is a crucial task in the battery management system 12.

Figure 4:
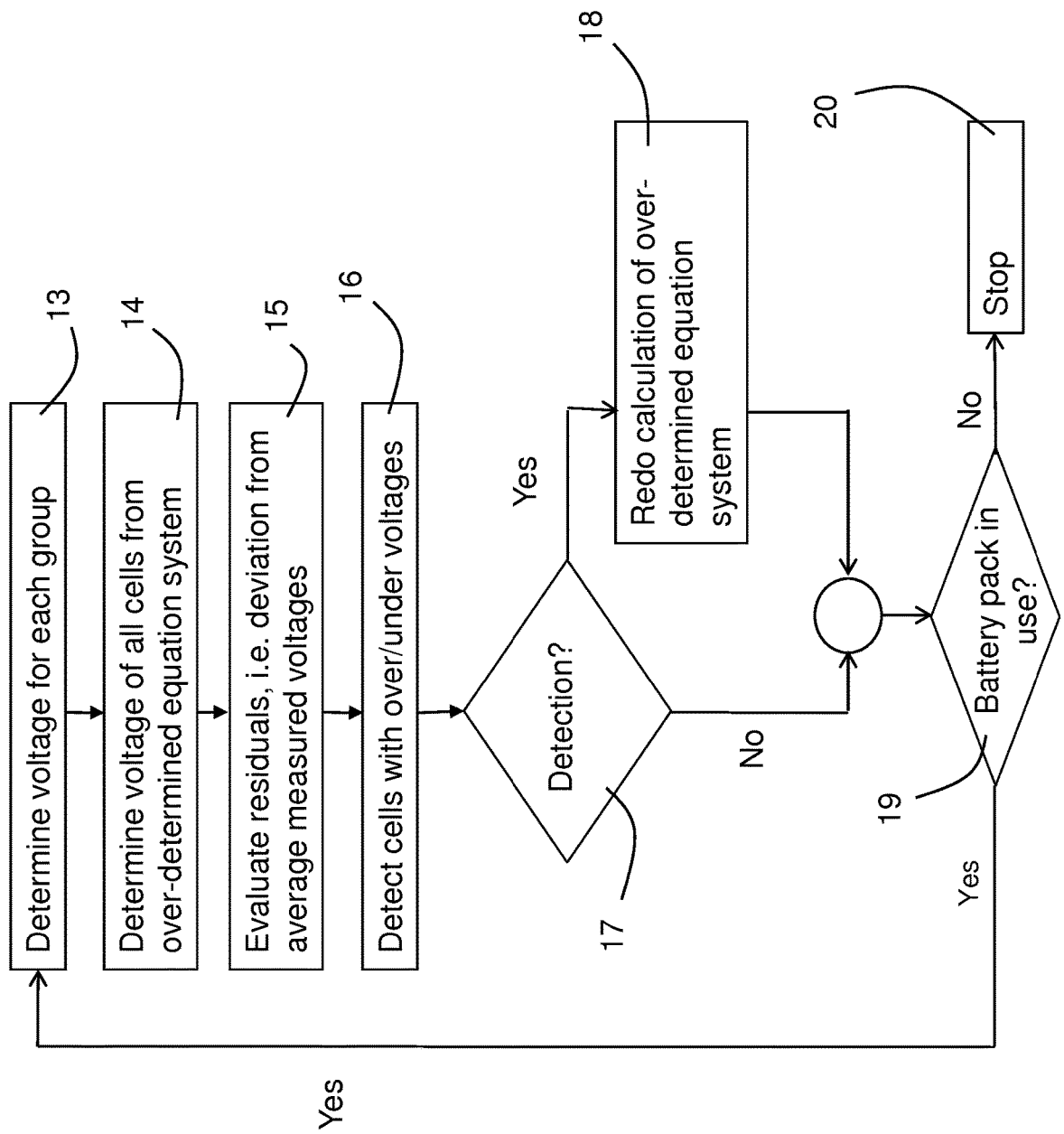
FIG. 4 is a flowchart illustrating the operation of an embodiment of the invention.

FIG. 4 shows a flow chart with the main steps of the proposed method. First, the method begins by obtaining the measurements from the voltage sensors (see step 13 in FIG. 4), i.e. the voltage measurements for each group G1-G3 as described above with reference to FIG. 3. The method as described involves the use of only five battery cells C1-C5 and three voltage sensors S1-S3. However, a commonly used battery pack 7a would use several hundreds of battery cells.

At step 14 of FIG. 4, the voltage of each cell will be estimated from the sensor outputs using the equations (1)-(7) as indicated below, where $n_x^{sens}$ is the number of battery cells for which measurements are obtained by a particular sensor x. In this example, $n_1^{sens}=2$, $n_2^{sens}=3$ and $n_3^{sens}=3$. The equations (1)-(7) define an over-determined system of linear equations, i.e. a system with more equations than unknowns.

$$u_1^{cell}=u_1^{sens}/n_1^{sens} \tag{1}$$

$$u_2^{cell}=u_1^{sens}/n_1^{sens} \tag{2}$$

$$u_2^{cell}=u_2^{sens}/n_2^{sens} \tag{3}$$

$$u_3^{cell}=u_2^{sens}/n_2^{sens} \tag{4}$$

$$u_4^{cell}=u_2^{sens}/n_2^{sens} \tag{5}$$

$$u_4^{cell}=u_3^{sens}/n_3^{sens} \tag{6}$$

$$u_5^{cell}=u_3^{sens}/n_3^{sens} \tag{7}$$

At step 15 of FIG. 4, residuals are obtained based on a model that uses information of the mean value of the battery cell voltage. This mean voltage $u_{mean}$ is calculated using the sensor outputs as shown in equation (8) below:

$$u_{mean} = \frac{\frac{u_1^{sens}}{n_1^{sens}} + \frac{u_2^{sens}}{n_2^{sens}} + \frac{u_3^{sens}}{n_3^{sens}}}{3} \tag{8}$$

The residuals can be regarded as deviations from the averaged measured voltages, which are close to zero during normal operating conditions, and which are defined according to equation $$u_{over\ v} = [u_{over\ v,1}, u_{over\ v,2}, u_{over\ v,3}] = \left[\frac{u_1^{sens}}{n_1^{sens}}, \frac{u_2^{sens}}{n_2^{sens}}, \frac{u_3^{sens}}{n_3^{sens}}\right] - u_{mean} \tag{9}$$

Consequently, as indicated in step 15 in FIG. 4, the residuals can be evaluated by defining them as deviations from the average measured values.

At step 16 of FIG. 4, the residuals are used for detecting battery cells with over-voltage or under-voltage, i.e. battery cells which can be expected to be faulty. This information related to battery cells which deviate from a normal behavior is useful in order to improve the system of linear equations (1)-(7), and hence, to get a better estimation of the voltage of each cell. The residual terms resulting from the equation system (1)-(7) are obtained in order to identify if any one of the battery cells has a cell measurement $U^{cell}$ which deviates from a particular threshold value. Such a threshold value can suitably be based on an average of the measured values from the remaining battery cells.

It can be noted that the higher the number of sensors, the better results will be obtained, since the mean voltage, $u_{mean}$(8), is less influenced by a cell with over-voltage or under-voltage.

In the following description, and for simplicity, it can be assumed that only one cell deviates from the rest of the cells ("single fault assumption"), but the same proposed method could be used for multiple cells deviating from the rest.

An over-voltage $U_{OV}$ is given by $$U_{OV}=\max(u_{over\ v}) \tag{10}$$

which is detected (see step 17 in FIG. 4) when $U_{OV} > \delta$, with the max value in (10) occurring at sensor $i$ \hfill (11)

where $\delta$ is a threshold to be defined based on how balanced the system is, and a tradeoff between sensitivity to faults and detection rate.

Now, it is checked if sensor $i-1$ (when $i>0$) or sensor $i+1$ (when $i>$total number of sensors), exceeds a sensor $i-1$ detection: $u_{over\ v,i-1} > U_{OV}*\gamma$ \hfill (12)

sensor $i+1$ detection: $u_{over\ v,i+1} > U_{OV}*\gamma$ \hfill (13)

threshold:

where $\gamma$ is a tunable constant between 0 and 1.

Similarly, in case of detecting a cell with under-voltage, a minimum function should be used in equation (10), and the inequalities (12)-(13) should be changed to "less than".

Finally, any cell with an over-voltage or under-voltage (as detected in step 17) could be identified by matching a row of the structural model shown in Table 1 below and the current fault signature shown in Table 2. This information is needed for step 18 in FIG. 4.

TABLE 1

| Structural model | | | |
|---|---|---|---|
| | Sensor 1 | Sensor 2 | Sensor 3 |
| Cell 1 | 1 | 0 | 0 |
| Cell 2 | 1 | 1 | 0 |
| Cell 3 | 0 | 1 | 0 |
| Cell 4 | 0 | 1 | 1 |
| Cell 5 | 0 | 0 | 1 |

TABLE 2

| Current fault signature | | | | | |
|---|---|---|---|---|---|
| Sensor 1 | ... | Sensor i − 1 | Sensor i | Sensor i + 1 | ... | Sensor n |
| 0 | | $\begin{cases} 1 \text{ if (12) holds} \\ 0 \text{ otherwise} \end{cases}$ | 1 | $\begin{cases} 1 \text{ if (13) holds} \\ 0 \text{ otherwise} \end{cases}$ | | 0 |

In step 18, the information of the faulty cell is used to update equations (1)-(7). Only equations that include the sensor or sensors that measure the faulty cell detected before, are modified. Again, this new set of equations defines an over-determined system of linear equations, for which an approximate solution can be obtained, for example, by linear least squares.

An example is presented in the following, in order to show in more detail the process involved in step 18 of FIG. 4. Consider an example with 5 cells in which Cell 1 has an over-voltage:

$$u_1^{cell} = \frac{u_1^{sens}}{n_1^{sens}} + \frac{f}{n_1^{sens}} \quad (14)$$

$$u_2^{cell} = \frac{u_1^{sens}}{n_1^{sens}} + \frac{f}{n_1^{sens}} \quad (15)$$

and f is defined as:

$$f = U_{OV} n_1^{sens} \quad (16)$$

Equations (3)-(7) and (14)-(16) define the over-determined system of linear equation, to be solved by, for example, linear least squares.

$$\begin{bmatrix} n_1^{sens} & 0 & 0 & 0 & 0 & -1 \\ 0 & n_1^{sens} & 0 & 0 & 0 & 1 \\ 0 & n_2^{sens} & 0 & 0 & 0 & 0 \\ 0 & 0 & n_2^{sens} & 0 & 0 & 0 \\ 0 & 0 & 0 & n_2^{sens} & 0 & 0 \\ 0 & 0 & 0 & n_3^{sens} & 0 & 0 \\ 0 & 0 & 0 & 0 & n_3^{sens} & 0 \\ 0 & 0 & 0 & 0 & 0 & 1/n_1^{sens} \end{bmatrix} \cdot \begin{pmatrix} u_1^{cell} \\ u_2^{cell} \\ u_3^{cell} \\ u_4^{cell} \\ u_5^{cell} \\ f \end{pmatrix} = \begin{pmatrix} u_1^{sens} \\ u_1^{sens} \\ u_2^{sens} \\ u_2^{sens} \\ u_2^{sens} \\ u_3^{sens} \\ u_3^{sens} \\ U_{OV} \end{pmatrix} \quad (17)$$

At step 19 of FIG. 4, a decision is made depending on whether the battery pack is still in use or not. If it is still in use, the process returns to step 13. If it is not in use, then the algorithm stops at step 20.

Measurements of the battery cell terminal voltages can consequently be used for detecting abnormal under-voltage or over-voltage conditions, which is important for reasons of reliability and safety of the battery pack.

In summary, the cell measurements for the battery cells C1-C5 are obtained by means of an over-determined equation system. Any residual terms resulting from this equation system will be evaluated in order to identify if there are any battery cell measurements which deviate from an expected value. Preferably, the cell measurements which correspond to the residual terms are provided by means of a recalculation of the over-determined equation system which uses information from the previous calculation of the equation system.

It is to be understood that the present invention is not limited to the embodiments described above and illustrated in the drawings; rather, the skilled person will recognize that many changes and modifications may be made within the scope of the appended claims. For example, although the battery terminal voltage (U) is normally used as a relevant sensor signal (see FIG. 3), other parameters may also be measured by means of the sensor unit, such as the temperature of the battery cells C1-C10 or the battery current.

The invention claimed is:

1. A method for monitoring the status of a plurality of battery cells in a battery pack, the method comprising:
    arranging the battery cells in at least two groups of cells;
    arranging the groups of cells in a manner so that:
    at least two of the groups comprise two or more cells, and
    at least two of the groups overlap so that a cell forms part of the overlapping groups; and
    connecting the sensor unit to the groups such that each of the groups is connected to a corresponding sensor (S1-S3) forming part of the sensor unit; and wherein the number of groups is less than the number of cells,
    obtaining, by means of the sensor unit, at least one sensor measurement for each group which is indicative of the state of operation of the battery pack;
    wherein the method further comprises:
    determining a cell measurement for each battery cell by means of solving an over-determined equation system of equations which defines the cell measurement as a function of the sensor measurement; and
    evaluating any residual terms resulting from the equation system in order to identify any battery cell having a cell measurement which deviates from an expected value based on the remaining battery cells.

2. Method according to claim 1, wherein the method further comprises:
    determining cell measurements corresponding to the residual terms by means of a recalculation of the over-determined equation system using information from the previous calculation of the equation system.

3. Method according to claim 2, wherein the method further comprises:
    providing the residual terms based on a comparison of a cell measurement with an average value of the cell measurements from the equation system.

4. Method according to claim 1, wherein the method further comprises:
    obtaining, by means of the sensor unit, the at least one sensor measurement in the form of a terminal voltage measurement of each battery cell or a temperature measurement of each battery cell.

5. Method according to claim 1, wherein it further comprises:
    arranging the groups of cells in a manner so that it fulfills a relationship:

number of groups−number of cells/2≥1.

6. A computer comprising a computer program for performing the method of claim 1 when the computer program is run on the computer.

7. A non-transitory computer readable medium containing a computer program for performing the method of claim 1 when the computer program is run on a computer.

8. A control unit for monitoring the status of a plurality of connected battery cells in a battery pack, the control unit being configured to perform the method according to claim 1.

9. A battery management system for monitoring the status of a plurality of connected battery cells in a battery pack, comprising:
    at least two groups of the plurality of cells;
    further comprising:
    an arrangement of the groups of cells wherein:
    at least two of the groups comprise two or more cells, and
    at least two of the groups overlap so that a cell forms part of the overlapping groups; and
    a connection between a sensor unit and the groups; wherein:
    a number of groups is less than a number of cells,
    a sensor unit connected to each of the groups, such that each of the groups is connected to a corresponding sensor forming part of the sensor unit, the sensor unit being configured for providing at least one sensor measurement for each group which is indicative of the state of operation of the battery pack; wherein it further comprises a battery control unit to which the sensor unit is connected, the battery control unit being configured for determining a cell measurement for each battery cell by means of solving an over-determined equation system of equations which defines the cell measurement as a function of the sensor measurement; wherein the battery control unit is also configured for evaluating any residual terms resulting from the equation system in order to identify any battery cell having a cell measurement which deviates from an expected value based on the remaining battery cells.

10. A battery management system according to claim 9, wherein the sensors are configured for measuring at least one parameter related to the state of operation of the battery cells, the parameter being at least one of the following: the terminal voltage of at least one battery cell; and the temperature of at least one battery cell.

11. A vehicle comprising a battery management system according to claim 9.

* * * * *